(12) United States Patent
Zheng

(10) Patent No.: US 11,043,540 B2
(45) Date of Patent: Jun. 22, 2021

(54) DETECTING CIRCUIT AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Yuan Zheng, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 255 days.

(21) Appl. No.: 16/332,370

(22) PCT Filed: Jan. 3, 2019

(86) PCT No.: PCT/CN2019/070166
§ 371 (c)(1),
(2) Date: Mar. 12, 2019

(87) PCT Pub. No.: WO2020/093582
PCT Pub. Date: May 14, 2020

(65) Prior Publication Data
US 2020/0176525 A1    Jun. 4, 2020

(30) Foreign Application Priority Data

Nov. 8, 2018   (CN) .......................... 201811327286.9

(51) Int. Cl.
*H01L 27/32* (2006.01)
*G01N 1/00* (2006.01)
*G01R 1/00* (2006.01)

(52) U.S. Cl.
CPC ................................ *H01L 27/3223* (2013.01)

(58) Field of Classification Search
CPC ......... G01N 1/00; G01N 2201/00; H02J 1/00; G01R 1/00
See application file for complete search history.

(56) References Cited

U.S. PATENT DOCUMENTS

| 5,764,569 | A | 6/1998 | Wright |
| 9,147,619 | B2 | 9/2015 | Lee |
| 2013/0020998 | A1* | 1/2013 | Howard .................... H02J 1/00 320/117 |

(Continued)

FOREIGN PATENT DOCUMENTS

| CN | 104992651 A | 10/2015 |
| CN | 206097859 U | 4/2017 |

*Primary Examiner* — Jermele M Hollington
*Assistant Examiner* — Temilade S Rhodes-Vivour
(74) *Attorney, Agent, or Firm* — Mark M. Friedman

(57) ABSTRACT

The present disclosure proposes a detecting circuit and a display device. The detecting circuit includes a cell test circuit controlling signal line, a cell test circuit data signal line, an array test driving unit and an FET. The cell test circuit controlling signal line is connected to a gate of the FET. The cell test circuit controlling signal line is connected to a drain of the FET. A common signal is further connected to a source of the FET. By using the detecting circuit, a panel with a narrow bezel and low production cost can be realized.

20 Claims, 4 Drawing Sheets

(56) References Cited

U.S. PATENT DOCUMENTS

| | | | |
|---|---|---|---|
| 2015/0022211 A1* | 1/2015 | Du | G09G 3/006 324/414 |
| 2015/0109018 A1* | 4/2015 | Ma | G09G 3/006 324/760.02 |
| 2016/0104402 A1* | 4/2016 | Kim | G09G 3/006 324/762.07 |
| 2017/0025051 A1* | 1/2017 | Li | G09G 3/006 |
| 2017/0046992 A1 | 2/2017 | Zhou | |

* cited by examiner

DETECTING CIRCUIT AND DISPLAY DEVICE

BACKGROUND

1. Field of the Disclosure

The present disclosure relates to the field of display technology, and more particularly, to a detecting circuit and a display device.

2. Description of the Related Art

An active-matrix organic light emitting diode (AMO-LED) panel is characteristic of self-luminescence. An AMO-LED has advantages of wide viewing angle and colors with high saturation, especially, low driving voltage and low power consumption. In addition, an AMOLED has merits such as swift response, light weight, compact size, simple structure, and low production costs. Owing to these features, the AMOLED panel is one of the most promising panels on the market.

The yield rate of an AMOLED panel relies on the AMO-LED technology nowadays. To monitor the production of the AMOLED panel in each producing process, generally, several detecting circuits are arranged in the panel to screen panels on operation normally in each producing process so as to prevent defective panels from going to posterior producing processes. Common detecting circuits include an array test circuit and a cell test circuit. The array test circuit detects the characteristics of a thin film transistor (TFT) in an array process, thereby screening defective panels in the array process. As for the cell test circuit, the cell test circuit detects a cell when the cell is lit before a module process. In the detecting techniques of the related art, the majority are detected separately with low efficiency. Besides, these means of detecting circuit occupies a large space of the pixel circuit, which causes the panel with low utilization, hinders the application of a narrow screen and an ultra-narrow screen, and is not conducive to control the production cost.

Therefore, the related art has some shortcomings and needs to be solved urgently.

In the related art, a detecting circuit and a panel both occupy a lot of space, which is unfavorable to design a panel with a narrow bezel and is easy to reduce the production cost.

SUMMARY

The present disclosure provides a detecting circuit and a display device to solve the above problem that a detecting circuit of the related art occupies too much space in a panel at the current technical level, which is unfavorable for designing a panel with a narrow bezel. That the production cost is high is dealt with by the present disclosure as well.

According to a first aspect of the present disclosure, a detecting circuit comprises: a cell test circuit controlling signal line, a cell test circuit data signal line, two and more array test driving units and two and more field-effect transistors (FETs) arranged sequentially along the cell test circuit controlling signal line. The cell test circuit controlling signal line is connected to a gate of the FET. The cell test circuit controlling signal line is connected to a drain of the FET. Each of the array test driving units comprises a first switch, a first data line, a first a metal-oxide semiconductor (MOS) transistor, a second switch, a second MOS transistor, a second data line, and a common signal line. The first data line is connected to a drain of the first MOS transistor. The first switch is connected to a gate of the first MOS transistor. The second data line is connected to a drain of the second MOS transistor. The second switch is connected to a gate of the second MOS transistor. A source of the second MOS transistor is connected to a source of the first MOS transistor and the common signal line. The common signal is further connected to a source of the FET.

wherein the first switch and the second switch control a signal to be input to the first data line and the second data line on each column; a switch terminal of the first switch and a switch terminal of the second switch are both the gates of the MOS transistor.

According to an embodiment of the present disclosure, the FET is an N-channel metal-oxide semiconductor (NMOS) thin film transistor (TFT) or a transistor.

According to an embodiment of the present disclosure, the FET is a P-channel metal-oxide semiconductor (PMOS) TFT.

According to an embodiment of the present disclosure, two and more switches, data lines, and MOS transistor are arranged in the array test driving unit.

According to an embodiment of the present disclosure, the cell test circuit data signal line controls whether to light a pixel image up or not.

According to an embodiment of the present disclosure, a high voltage is imposed on the gate of the FET when the array test driving unit is conducted.

According to an embodiment of the present disclosure, a low voltage is imposed on the gate of the FET when a cell test circuit operates.

According to a second aspect of the present disclosure, a detecting circuit comprises a cell test circuit controlling signal line, a cell test circuit data signal line, two and more array test driving units and two and more field-effect transistors (FETs) arranged sequentially along the cell test circuit controlling signal line. The cell test circuit controlling signal line is connected to a gate of the FET. The cell test circuit controlling signal line is connected to a drain of the FET. Each of the array test driving units comprises a first switch, a first data line, a first a metal-oxide semiconductor (MOS) transistor, a second switch, a second MOS transistor, a second data line, and a common signal line. The first data line is connected to a drain of the first MOS transistor. The first switch is connected to a gate of the first MOS transistor. The second data line is connected to a drain of the second MOS transistor. The second switch is connected to a gate of the second MOS transistor. A source of the second MOS transistor is connected to a source of the first MOS transistor and the common signal line. The common signal is further connected to a source of the FET.

According to an embodiment of the present disclosure, the FET is an N-channel metal-oxide semiconductor (NMOS) thin film transistor (TFT) or a transistor.

According to an embodiment of the present disclosure, the FET is a P-channel metal-oxide semiconductor (PMOS) TFT.

According to an embodiment of the present disclosure, two and more switches, data lines, and MOS transistor are arranged in the array test driving unit.

According to an embodiment of the present disclosure, the first switch and the second switch control a signal to be input to the first data line and the second data line on each column.

According to an embodiment of the present disclosure, the cell test circuit data signal line controls whether to light a pixel image up or not.

According to an embodiment of the present disclosure, a switch terminal of the first switch and a switch terminal of the second switch are both the gates of the MOS transistor.

According to an embodiment of the present disclosure, a high voltage is imposed on the gate of the FET when the array test driving unit is conducted.

According to an embodiment of the present disclosure, a low voltage is imposed on the gate of the FET when a cell test circuit operates.

According to a third aspect of the present disclosure, a display device comprises a cell test circuit controlling signal line, a cell test circuit data signal line, two and more array test driving units and two and more field-effect transistors (FETs) arranged sequentially along the cell test circuit controlling signal line. The cell test circuit controlling signal line is connected to a gate of the FET. The cell test circuit controlling signal line is connected to a drain of the FET. Each of the array test driving units comprises a first switch, a first data line, a first a metal-oxide semiconductor (MOS) transistor, a second switch, a second MOS transistor, a second data line, and a common signal line. The first data line is connected to a drain of the first MOS transistor. The first switch is connected to a gate of the first MOS transistor. The second data line is connected to a drain of the second MOS transistor. The second switch is connected to a gate of the second MOS transistor. A source of the second MOS transistor is connected to a source of the first MOS transistor and the common signal line. The common signal is further connected to a source of the FET.

According to an embodiment of the present disclosure, the FET is an N-channel metal-oxide semiconductor (NMOS) thin film transistor (TFT) or a transistor.

According to an embodiment of the present disclosure, the FET is a P-channel metal-oxide semiconductor (PMOS) TFT.

According to an embodiment of the present disclosure, two and more switches, data lines, and MOS transistor are arranged in the array test driving unit.

The present disclosure brings a benefit: Compared with the related art, a cell test circuit controlling thin film transistor (TFT), a cell test circuit switch controlling signal line, and a cell test circuit data signal line are utilized in the present disclosure to effectively share the array test circuit and the cell test circuit. In this way, the space of the panel that the array test circuit and the space of the cell test circuit occupy are shrunk in separate tests, which is good for producing a panel with a narrow bezel and reducing the production cost.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE EMBODIMENTS

For the purpose of description rather than limitation, the following provides such specific details as a specific system structure, interface, and technology for a thorough understanding of the application. However, it is understandable by persons skilled in the art that the application can also be implemented in other embodiments not providing such specific details. In other cases, details of a well-known apparatus, circuit and method are omitted to avoid hindering the description of the application by unnecessary details.

In the disclosure, it is should be understood that spatially relative terms, such as "center", "longitudinal", "lateral", "length", "width", "above", "below", "front", "back", "left", "right", "horizontal", "vertical", "top", "bottom", "inner", "outer", "clockwise", "counterclockwise", "axial", "radial", "circumferential", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The spatially relative terms are not limited to specific orientations depicted in the figures.

Figure 1:
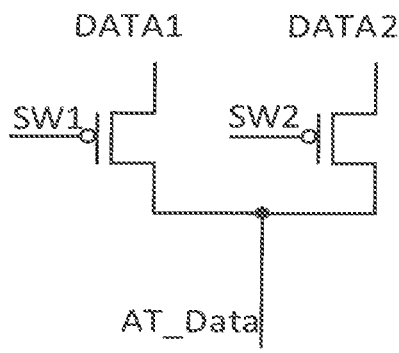
FIG. 1 illustrates a circuit diagram of an array test driving unit according to an embodiment of the present disclosure.

Please refer to FIG. 1 illustrating a circuit diagram of an array test driving unit according to an embodiment of the present disclosure. An array test circuit is adopted in the present disclosure. The array test circuit is between a signal 1 and a signal 2. Each array driving circuit includes a data line DATA, controlling switches SW, a thin film transistor (TFT) which each of the controlling switches SW corresponds to, and a signal line AT_Data. As FIG. 1 illustrates, a first switch SW1 and a second switch SW2 are controlling switches of a switch controlling signal line of a metal-oxide semiconductor (MOS) transistor. The MOS transistor is connected to the first switch SW1 and the second switch SW2. The DATA1 is connected to a drain of the first MOS transistor. The first switch SW1 is connected to a gate of the first MOS transistor. The DATA2 is connected to a drain of the second MOS transistor. The second switch SW2 is connected to a gate of the second MOS transistor. A source of the second MOS transistor is connected to a source of the first MOS transistor and a common signal line AT_Data. Whether the controlling signal is input or not is controlled by turning the first switch SW1 and the second switch SW2 on or off. In the present disclosure, a P-channel metal-oxide semiconductor (PMOS) TFT as the MOS transistor is adopted for example. Or, other kinds of metal-oxide semiconductors (MOSs) may be adopted in a real application in other embodiments.

Figure 2:
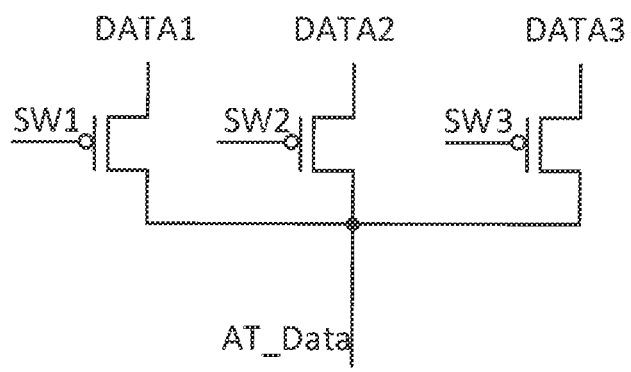
FIG. 2 illustrates a circuit diagram of an array driving unit according to another embodiment of the present disclosure.

FIG. 2 illustrates a circuit diagram of a singular array driving unit including a set of circuit signal 1, circuit signal 2, and circuit signal 3 according to the embodiment of the present disclosure. Signal controlling switches are first switch SW 1, second switch SW2, and third switch SW3.

When a controlling switch SW which each of the MOS transistors corresponds to is turned on based on the two array driving unit circuits as illustrated in FIG. 1 and FIG. 2, a signal through the signal line DATA which the above TFT corresponds to can be input to the AT_Data at a lower terminal of the circuit. If the controlling switch SW which the MOS transistor corresponds to is not turned off, the signal Data which the circuit corresponds to fails to be input through the AT_Data line. In this way, the function of the array test circuit works.

Figure 3:
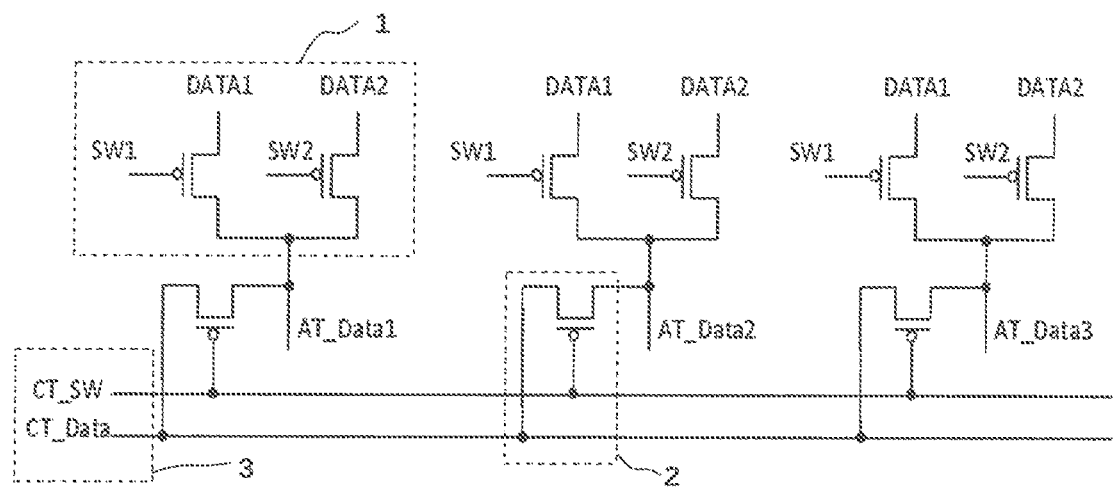
FIG. 3 illustrates a schematic diagram of a detecting circuit according to another embodiment of the present disclosure.

FIG. 3 illustrates a schematic diagram of a detecting circuit according to another embodiment of the present disclosure. As illustrated in FIG. 3, three areas 1, 2, 3 are used for a plurality of array driving units 1, a plurality of field-effect transistors (FETs) 2, and a cell test circuit controlling signal line and a cell test circuit data signal line 3, respectively. The structure and function of the plurality of array driving units 1 is the same as the structure and function of the circuit as illustrated in FIG. 1 or FIG. 2. The plurality of array driving units 1 are arranged in the detecting circuit proposed by the present disclosure. A source of the FET is connected to a common signal line AT_Data in the array driving unit 1 in the plurality of FETs 2. The FET is an N-channel metal-oxide semiconductor (NMOS) TFT, a P-channel metal-oxide semiconductor (PMOS) TFT, or a transistor. The cell test circuit controlling signal line and the cell test circuit data signal line 3 are arranged in the area 3.

The area 2 and the area 3 increase the circuit by increasing the added cell test circuit to control the switch to converse the array test testing circuit into the cell test testing circuit and vice versa. The array test testing circuit and cell test circuit share in the entire detecting circuit. When the array test circuit operates, a gate of the FET in the area 2 controlled by the cell test circuit is connected to a high voltage level, and the cell test circuit signal line CT_Data on the cell test circuit in the area 3 is connected to a high voltage. So the FET in the area 2 is on a turned-off state, and the signal fails to be connected to the common signal line AT_Data, which forms the array test circuit. When the cell test circuit operates, a gate of the FET in the area 2 controlled by the cell test circuit is connected to a low voltage level, and the cell test circuit signal line CT_Data on the cell test circuit in the area 3 is connected to the common signal line AT_Data. Meanwhile, an inputting signal on the array test is floating and unaffected to makes the cell test circuit operate normally. By changing the above two signals, in conjunction with the circuit proposed by the present disclosure, the array test circuit is integrated with the cell test circuit, which can be well applied to a panel with a narrow bezel.

Figure 4:
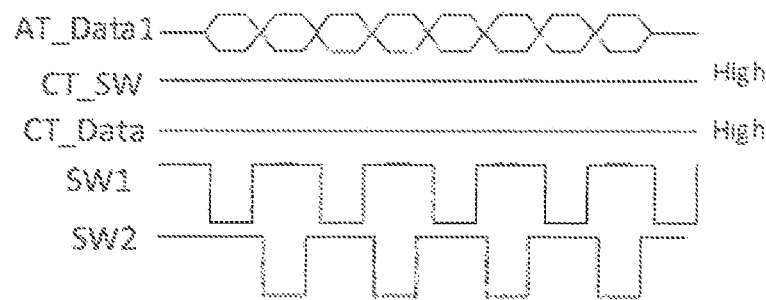
FIG. 4 illustrates a timing diagram of an array test circuit on operation according to another embodiment of the present disclosure.

FIG. 4 illustrates a timing diagram of an array test circuit on operation according to another embodiment of the present disclosure. In conjunction with FIG. 1 where an array test driving unit circuit is illustrated, a CT_SW/CT_Data in an area 3 is at a high voltage level and a controlling switch of a cell test in an area 2 is turned off while the array test circuit operates. The array test circuit cooperates with a SW switch through an AT_Data signal line in the area 1 to provide a signal for each pixel in order to pass an array test circuit array test.

Figure 5:
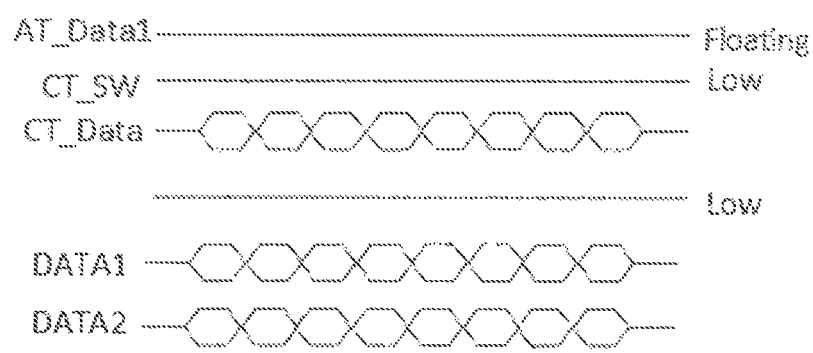
FIG. 5 illustrates a timing diagram of the cell test testing circuit with an operating grayscale image according to the embodiment of the present disclosure.

FIG. 5 illustrates a timing diagram of the cell test testing circuit with an operating grayscale image according to the embodiment of the present disclosure. In the area 1, the AT_Data in the area 1 is floating and keeps on an unaffected state. At this time, the CT_SW in the area 3, the SW1 in the area 1, and the SW2 in the area 1 are at a low voltage level. A signal of the CT_Data in the area 3 can be output to the data line in the area 1 and light up a controlling pixel node by controlling CT_Data signal voltage, thereby lighting white, black, grayscale images up.

Figure 6:
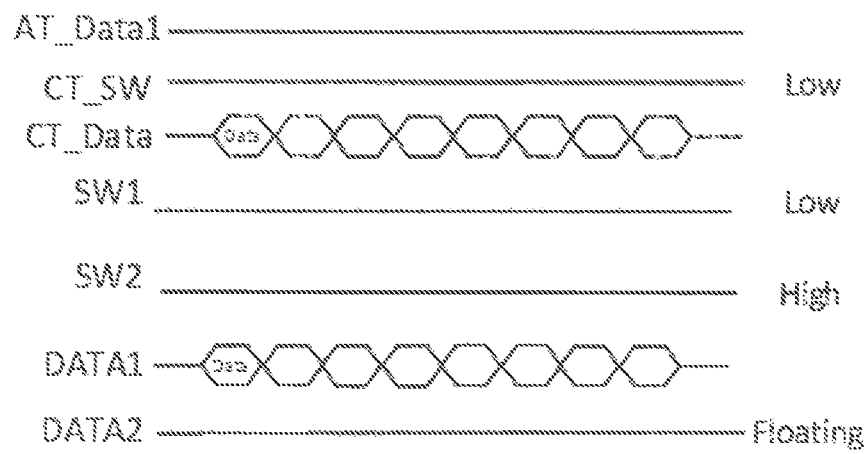
FIG. 6 illustrates a second timing diagram of a cell test testing circuit on operation according to another embodiment of the present disclosure.
Figure 7:
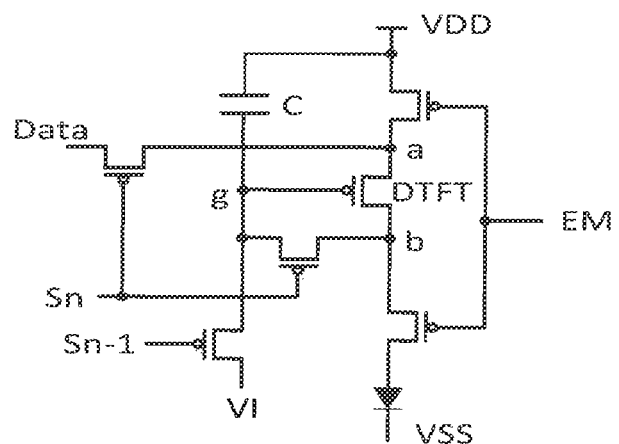
FIG. 7 illustrates a diagram of a pixel according to another embodiment of the present disclosure.
Figure 8:
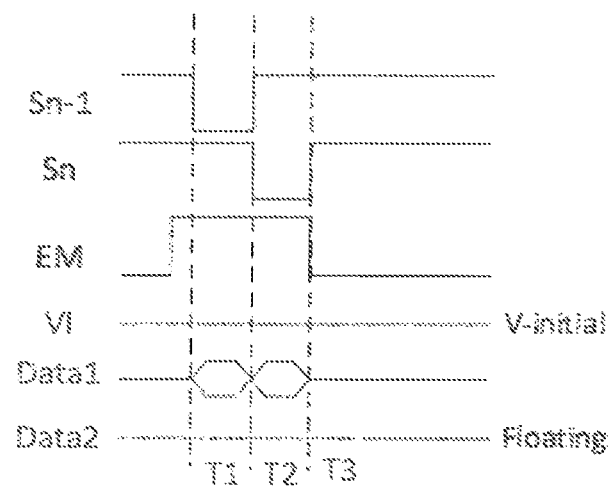
FIG. 8 illustrates a timing diagram of a pixel circuit according to another embodiment of the present disclosure.

FIG. 6 illustrates a second timing diagram of a cell test testing circuit on operation according to another embodiment of the present disclosure. FIG. 7 illustrates a diagram of a pixel according to another embodiment of the present disclosure. FIG. 8 illustrates a timing diagram of a pixel circuit according to another embodiment of the present disclosure. Please refer to FIG. 6, FIG. 7, and FIG. 8. When a cell test testing circuit operates with the pixel circuit, a column of pixels are lit up and the AT_Data keeps floating and unaffected. The CT_SW in the area 3 and the SW1 in the area 1 are at a low voltage level, and the SW2 in the area 1 is at a high voltage level. A DATA1 is a CT_Data signal, and a DATA2 keeps floating and unaffected. A reset operation exists in the pixel circuit of the related art as illustrated in FIG. 7 because the DATA2 keeps floating and unaffected. During a period T1, a signal Sn-1 is triggered, and a reset default voltage is applied to a node g. During a period T2, a signal Sn is triggered, and a DATA voltage is written to a node a. Therefore, the pixel circuit which the DATA1 in the area 1 corresponds to will be written to the CT_Data voltage in the area 3. Because the DATA2 is on a floating and unaffected state, the voltage imposed on the DATA2 is nearly the same as the default voltage. The default voltage is at a low voltage level so a pixel which the DATA2 corresponds to will illuminate light. Meanwhile, the CT_Data voltage in the area 3 is high to light a column of pixels up. Similarly, the controlling SW1 in the area 1 is at a high voltage level and the controlling SW2 in the area 1 is at a low voltage level, which controls different columns of pixels to be lit up.

Figure 9:
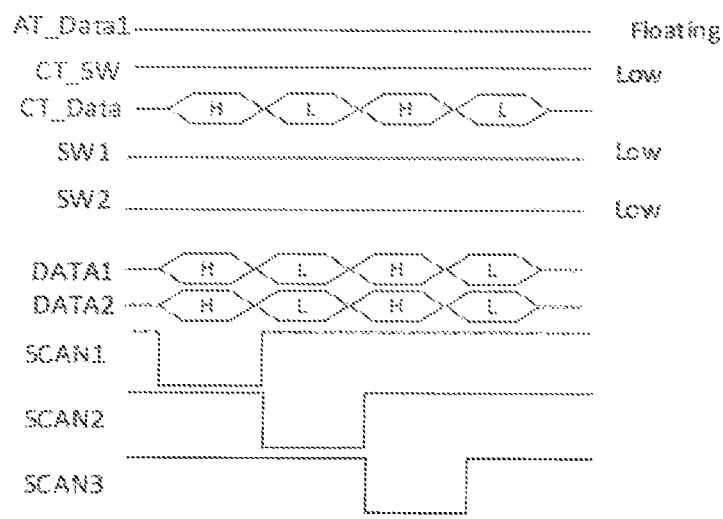
FIG. 9 illustrates a timing diagram of a cell test testing circuit on operation according to another embodiment of the present disclosure.

FIG. 9 illustrates a timing diagram of a cell test testing circuit on operation according to another embodiment of the present disclosure. The row of pixels can be lit up with a gate driver on array (GOA) circuit. The AT_Data in the area 1 is floating and keeps on an uncontrollable state. The CT_SW in the area 3, the SW1 in the area 1, and the SW2 in the area 1 are at a low voltage level. At this time, the signal of the cell test data signal line CT_Data in the area 3 can be output to the data line DATA. The CT_Data outputs a high voltage-level signal on the first scanning line SCAN1 and outputs a low voltage-level signal on the first scanning line SCAN2 through the CT_Data signal voltage as well as the whole circuit. Repetition by repetition, pixels on different rows are controlled to be lit up, thereby lighting pixels on rows up.

The present disclosure further provides a display device. The display device includes a detecting circuit as introduced above inside. An array test testing circuit shares a cell test testing circuit.

From the above embodiments, a cell test circuit controlling thin film transistor (TFT), a cell test circuit switch controlling signal line, and a cell test circuit data signal line are utilized in the present disclosure to effectively share the array test circuit and the cell test circuit. In this way, the space of the panel that the array test circuit and the space of the cell test circuit occupy are shrunk in separate tests, which is good for producing a panel with a narrow bezel and reducing the production cost.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A detecting circuit, comprising:
a cell test circuit controlling signal line;
a cell test circuit data signal line;
two and more array test driving units and two or more field-effect transistors (FETs) arranged sequentially along the cell test circuit controlling signal line;
the cell test circuit controlling signal line being connected to a gate of the FET;
the cell test circuit controlling data line being connected to a drain of the FET;
each of the array test driving units comprising a first switch, a first data line, a first a metal-oxide semiconductor (MOS) transistor, a second switch, a second MOS transistor, a second data line, and a common signal line;
the first data line being connected to a drain of the first MOS transistor; the first switch being connected to a gate of the first MOS transistor;
the second data line being connected to a drain of the second MOS transistor; the second switch being connected to a gate of the second MOS transistor; a source of the second MOS transistor being connected to a source of the first MOS transistor and the common signal line;
the common signal being further connected to a source of the FET;
wherein the first switch and the second switch control a signal to be input to the first data line and the second data line on each column; a switch terminal of the first switch and a switch terminal of the second switch are both the gates of the MOS transistor.

2. The detecting circuit of claim 1, wherein the FET is an N-channel metal-oxide semiconductor (NMOS) thin film transistor (TFT) or a transistor.

3. The detecting circuit of claim 1, wherein the FET is a P-channel metal-oxide semiconductor (PMOS) TFT.

4. The detecting circuit of claim 1, wherein two or more switches, data lines, and MOS transistor are arranged in the array test driving unit.

5. The detecting circuit of claim 1, wherein the cell test circuit data signal line controls whether to light a pixel image up or not.

6. The detecting circuit of claim 1, wherein a high voltage is imposed on the gate of the FET when the array test driving unit is conducted.

7. The detecting circuit of claim 1, wherein a low voltage is imposed on the gate of the FET when a cell test circuit operates.

8. A detecting circuit, comprising:
a cell test circuit controlling signal line;
a cell test circuit data signal line;
two or more array test driving units and two or more field-effect transistors (FETs) arranged sequentially along the cell test circuit controlling signal line;
the cell test circuit controlling signal line being connected to a gate of the FET;
the cell test circuit controlling data being connected to a drain of the FET;
each of the array test driving units comprising a first switch, a first data line, a first a metal-oxide semiconductor (MOS) transistor, a second switch, a second MOS transistor, a second data line, and a common signal line;
the first data line being connected to a drain of the first MOS transistor; the first switch being connected to a gate of the first MOS transistor;
the second data line being connected to a drain of the second MOS transistor; the second switch being connected to a gate of the second MOS transistor; a source of the second MOS transistor being connected to a source of the first MOS transistor and the common signal line;
wherein the common signal is connected to a source of the FET.

9. The detecting circuit of claim 8, wherein the FET is an N-channel metal-oxide semiconductor (NMOS) thin film transistor (TFT) or a transistor.

10. The detecting circuit of claim 8, wherein the FET is a P-channel metal-oxide semiconductor (PMOS) TFT.

11. The detecting circuit of claim 8, wherein two or more switches, data lines, and MOS transistor are arranged in the array test driving unit.

12. The detecting circuit of claim 8, wherein the first switch and the second switch control a signal to be input to the first data line and the second data line on each column.

13. The detecting circuit of claim 8, wherein the cell test circuit data signal line controls whether to light a pixel image up or not.

14. The detecting circuit of claim 8, wherein a switch terminal of the first switch and a switch terminal of the second switch are both the gates of the MOS transistor.

15. The detecting circuit of claim 8, wherein a high voltage is imposed on the gate of the FET when the array test driving unit is conducted.

16. The detecting circuit of claim 8, wherein a low voltage is imposed on the gate of the FET when a cell test circuit operates.

17. A display device, comprising:
a cell test circuit controlling signal line;
a cell test circuit data signal line;
two or more array test driving units and two or more field-effect transistors (FETs) arranged sequentially along the cell test circuit controlling signal line;
the cell test circuit controlling signal line being connected to a gate of the FET;
the cell test circuit controlling data line being connected to a drain of the FET;
each of the array test driving units comprising a first switch, a first data line, a first a metal-oxide semiconductor (MOS) transistor, a second switch, a second MOS transistor, a second data line, and a common signal line;
the first data line being connected to a drain of the first MOS transistor; the first switch being connected to a gate of the first MOS transistor;
the second data line being connected to a drain of the second MOS transistor; the second switch being connected to a gate of the second MOS transistor; a source of the second MOS transistor being connected to a source of the first MOS transistor and the common signal line;
wherein the common signal is connected to a source of the FET.

18. The display device of claim 17, wherein the FET is an N-channel metal-oxide semiconductor (NMOS) thin film transistor (TFT) or a transistor.

19. The display device of claim 17, wherein the FET is a P-channel metal-oxide semiconductor (PMOS) TFT.

20. The display device of claim 17, wherein two or more switches, data lines, and MOS transistor are arranged in the array test driving unit.

\* \* \* \* \*